(12) United States Patent
Zoellin et al.

(10) Patent No.: US 8,659,100 B2
(45) Date of Patent: Feb. 25, 2014

(54) MEMS COMPONENT HAVING A DIAPHRAGM STRUCTURE

(75) Inventors: Jochen Zoellin, Stuttgart (DE); Ricardo Ehrenpfordt, Korntal-Muenchingen (DE); Ulrike Scholz, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/350,350

(22) Filed: Jan. 13, 2012

(65) Prior Publication Data
US 2012/0235256 A1 Sep. 20, 2012

(30) Foreign Application Priority Data
Mar. 17, 2011 (DE) .......................... 10 2011 005 676

(51) Int. Cl.
*H04R 23/00* (2006.01)
*G01L 9/00* (2006.01)

(52) U.S. Cl.
USPC ......................................... 257/419; 257/418

(58) Field of Classification Search
USPC .................................. 257/415–420
See application file for complete search history.

(56) References Cited

U.S. PATENT DOCUMENTS

| | | | |
|---|---|---|---|
| 7,557,417 B2 * | 7/2009 | Theuss et al. ................. | 257/415 |
| 7,795,695 B2 * | 9/2010 | Weigold et al. ............... | 257/419 |
| 7,888,754 B2 * | 2/2011 | Omura et al. ................. | 257/419 |
| 7,994,594 B2 * | 8/2011 | Inaba et al. ................... | 257/416 |
| 8,049,287 B2 * | 11/2011 | Combi et al. ................. | 257/416 |
| 8,178,936 B2 * | 5/2012 | Zhe et al. ...................... | 257/416 |
| 2004/0012062 A1 * | 1/2004 | Miyajima et al. ............. | 257/419 |
| 2007/0040231 A1 * | 2/2007 | Harney et al. ................. | 257/415 |
| 2007/0262401 A1 * | 11/2007 | Yokoyama et al. ........... | 257/415 |
| 2008/0128841 A1 * | 6/2008 | Fujimori et al. .............. | 257/418 |
| 2008/0164545 A1 * | 7/2008 | Hsiao ............................ | 257/416 |
| 2011/0222717 A1 * | 9/2011 | Kuratani et al. .............. | 381/355 |
| 2011/0241137 A1 * | 10/2011 | Huang et al. .................. | 257/419 |
| 2011/0248364 A1 * | 10/2011 | Huang et al. .................. | 257/416 |
| 2011/0309458 A1 * | 12/2011 | Gamage et al. ............... | 257/419 |
| 2012/0001275 A1 * | 1/2012 | Chi et al. ...................... | 257/415 |
| 2012/0087521 A1 * | 4/2012 | Delaus et al. ................. | 381/174 |

FOREIGN PATENT DOCUMENTS

DE 10 2011 040 370 3/2012

* cited by examiner

*Primary Examiner* — Ngan Ngo
(74) *Attorney, Agent, or Firm* — Kenyon & Kenyon LLP

(57) ABSTRACT

A wafer-level-based packaging concept for MEMS components having at least one diaphragm structure formed in the component front side is described, according to which an interposer is connected to the front side of the MEMS component, which has at least one passage aperture as an access opening to the diaphragm structure of the MEMS component and which is provided with electrical through contacts so that the MEMS component is electrically contactable via the interposer. The cross-sectional area of the at least one passage aperture in the interposer is to be designed as significantly smaller than the lateral extension of the diaphragm structure of the MEMS component. The at least one passage aperture opens into a cavity between the diaphragm structure and the interposer.

9 Claims, 2 Drawing Sheets

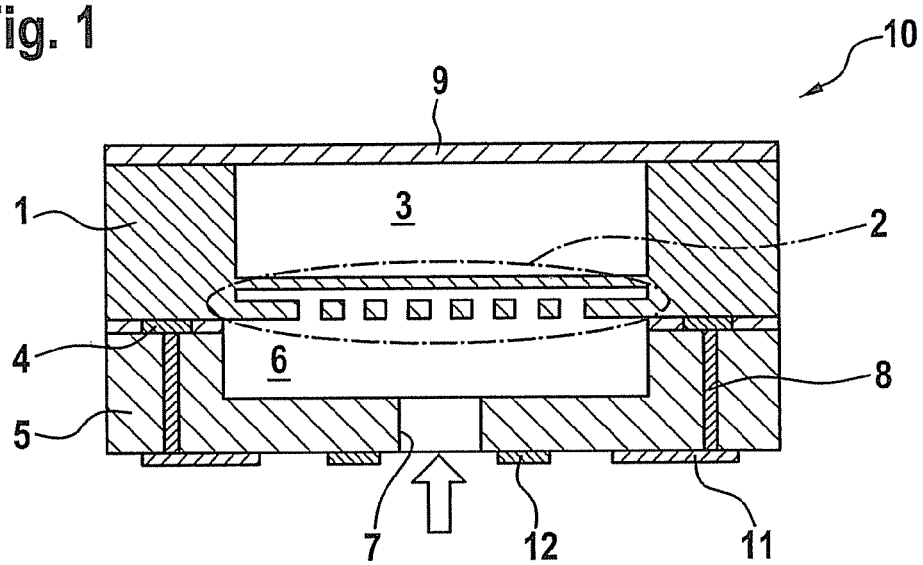
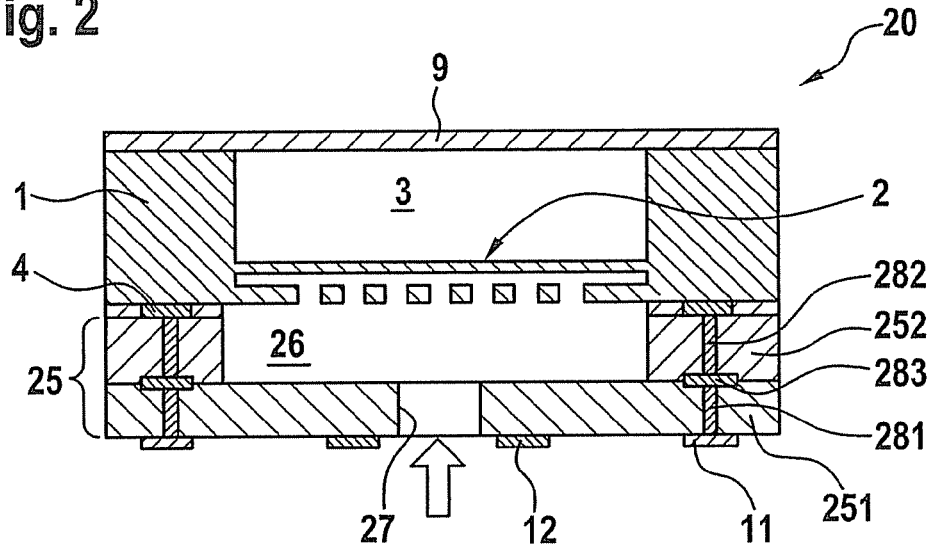

MEMS COMPONENT HAVING A DIAPHRAGM STRUCTURE

CROSS REFERENCE

The present application claims the benefit under 35 U.S.C. §119 of German Patent Application No. 102011005676.9 filed on Mar. 17, 2011, which is expressly incorporated herein by reference in its entirety.

FIELD OF THE INVENTION

The present invention relates very generally to the packaging of MEMS (micro-electromechanical system) components within the scope of the wafer level packaging (Assembly and Connection Technology) and in particular the packaging of MEMS components having a diaphragm structure, which is formed in the component front side. Such a component may, for example, be a pressure sensor, a loudspeaker, or a microphone component. These applications require a media access in the packaging.

BACKGROUND INFORMATION

The packaging of MEMS components is used, on the one hand, for the mechanical protection of the chip. On the other hand, the packaging allows the mechanical and electrical incorporation of the component within the scope of the second-level assembly, for example, on a printed circuit board. Packages or ceramic housings based on printed circuit boards are typically used in practice as the packaging for MEMS components. Both packaging concepts are associated with a relatively high manufacturing expenditure. In addition, the conventional packages are relatively large in comparison to the chip size.

German Patent Application No. 10 2010 040 370.9 describes a wafer-level-based packaging concept for MEMS microphone components. According to one form of implementation of this packaging concept, the front side of the MEMS microphone component, in which the microphone diaphragm is implemented, is provided with a cap wafer. It functions as an interposer for the second-level assembly and is therefore provided with electrical through contacts, via which the MEMS microphone component is electrically contactable.

The package is thus implemented here in the form of a wafer stack, the diaphragm structure and optionally an integrated electrical circuit of the micromechanical microphone chip being protected by the interposer. This package may be assembled and electrically contacted using standard methods. A special advantage of this packaging variant is that not only are the micromechanical and circuitry functionality of the microphone chip and the structure and electrical functionality of the interposer applied and produced in the wafer composite, but rather also the connection of microphone chip and interposer is manufactured in the wafer composite. The packages are only separated thereafter. This very extensive parallelization of chip manufacturing and packaging is extraordinarily efficient, which affects the manufacturing process and the manufacturing costs. In addition, the component size may thus be reduced to a minimum. Such packages require extraordinarily little printed circuit board space and have a very small overall height. This miniaturization both in area and also in height opens up manifold options for the development of novel and improved final products having microphone function.

The introduction of sound occurs in the package described in German Patent Application No. 10 2010 040 370.9 via a passage aperture in the interposer, whose aperture area generally corresponds to the diaphragm area of the MEMS microphone component.

This layout of the interposer has the effect that only a very limited area is available for the connection contacts of the second-level assembly on the assembly side of the package, i.e., on the surface of the interposer facing away from the MEMS microphone component. The larger the passage aperture in the interposer, the greater the risk that the sensitive diaphragm structure of the MEMS microphone component will additionally be contaminated or damaged during and after the second-level assembly.

SUMMARY

The present invention refines the wafer-level-based packaging concept described in German Patent Application No. 10 2010 040 370.9.

In accordance with the present invention, the cross-sectional area of the at least one passage aperture in the interposer is laid out to be significantly smaller than the area of the diaphragm structure of the MEMS component. The at least one passage aperture opens into a cavity between the diaphragm structure and the interposer. The passage aperture in the interposer and the cavity between the diaphragm structure and the interposer are, with respect to each other, variable in size, shape, and/or position.

In this layout, a relatively large area of the interposer is available for the second-level assembly. The stress coupling of the second-level assembly therefore occurs primarily on the interposer and less on the MEMS component. In addition, comparatively large-area connection contacts may be provided for the electrical contacting of the package, which are equally suitable for LGA (land grid array) contacting and for BGA (ball grid array) contacting of the package. Through the shrinking of the passage aperture according to the present invention, the risk of contamination or damage of the sensitive diaphragm structure is also significantly reduced.

In a preferred form of implementation of the present invention, the contact areas for electrically contacting the component within the scope of the second-level assembly therefore extend beyond the area of the MEMS structure, i.e., beyond the diaphragm area.

As already mentioned, the example component according to the present invention may be extensively processed at the wafer level, i.e., in mass production. This type of manufacturing requires the interposer to be implemented in the form of a chip having the same chip surface area as the MEMS component. To form a cavity between the diaphragm structure and the interposer, the surface of the interposer chip facing toward the MEMS component may simply be provided with a cavity, whose lateral extension at least corresponds to that of the diaphragm structure. However, the interposer may also be implemented in the form of a chip stack, which includes a planar interposer chip having the same chip surface area as the MEMS component, and at least one spacer. In this case, the passage aperture is situated in the planar interposer chip, which is mechanically and electrically connected via the spacer to the component front side, so that there is a cavity between the diaphragm structure and the interposer. For example, a second planar chip having a passage aperture may simply function as the spacer, which—in contrast to the passage aperture in the interposer chip—extends at least over the entire diaphragm structure.

It may be particularly advantageous if an ASIC functions as the interposer. In this case, at least parts of the circuit required for operating the MEMS component may be displaced from the MEMS component to the ASIC. The "footprint" surface area of the MEMS component may thus be reduced, which contributes as a whole to the miniaturization of the component. The ASIC is preferably assembled having its rear side on the front side of the MEMS component, so that the component may be assembled very easily in flip-chip technology on a circuit board. The front side of the ASIC, which is provided with circuit elements, is thus protected here by the second-level assembly of the component.

The interposer may also function as a carrier for at least one further component, however, if the chip surface area of this component is significantly smaller than the diaphragm area of the MEMS component. In this case, the further component, for example, an ASIC, may be situated easily in the area of the cavity on the interposer. The interposer is also equipped with electrical through contacts for electrically contacting this further component.

In some applications, for example, pressure sensors or microphones, it has proven to be advantageous to seal the media access, i.e., the passage aperture in the interposer, to the second-level assembly area. For this purpose, a sealing material in the form of a sealing ring for the second-level assembly of the component may be applied easily to the surface of the interposer facing away from the MEMS component in the border area of the passage aperture. Since the passage aperture in the interposer is relatively small in comparison to the diaphragm area and therefore also in comparison to the "footprint" of the component, this sealing measure does not have a negative effect on the component size. In addition, the position, shape, and/or size of the sealing ring may be designed variably.

The rear side of the MEMS component may be protected easily, also at wafer level, by applying at least one further layer. This may be a film or a rear wafer, in particular made of plastic, glass, or a semiconductor material.

The packaging concept according to the present invention is also suitable in particular for MEMS microphone components. The passage aperture in the interposer is used as a sound inlet aperture, which forms the front volume together with the cavity between the microphone diaphragm and the interposer. The rear side volume of the microphone diaphragm may be easily closed, and thus defined, by a wafer on the rear side of the MEMS microphone component. This rear wafer is advantageously structured. It may be provided with a recess to enlarge the rear side volume and/or with vents, which communicate with the rear side volume of the microphone diaphragm. The MEMS microphone packages implemented in this way may be assembled above an acoustical aperture in the printed circuit board using standard methods. The packaging according to the present invention thus requires neither a special design or special manufacturing processes for the microphone chip nor special packaging and assembly techniques.

As already discussed above, there are various options for advantageously implementing and refining the teaching of the present invention. For this purpose, reference is made to the description below of multiple exemplary embodiments of the present invention on the basis of the figures. Although all exemplary embodiments relate to the packaging of an MEMS microphone component, the present invention is not restricted to this special application, but rather relates very generally to the packaging of MEMS components having a diaphragm structure.

BRIEF DESCRIPTION OF THE DRAWINGS

FIG. 1 through FIG. 3 each show a schematic sectional view of an MEMS microphone package 10, 20, and 30 constructed according to example embodiments of the present invention.

DETAILED DESCRIPTION OF EXAMPLE EMBODIMENTS

Figure 3:
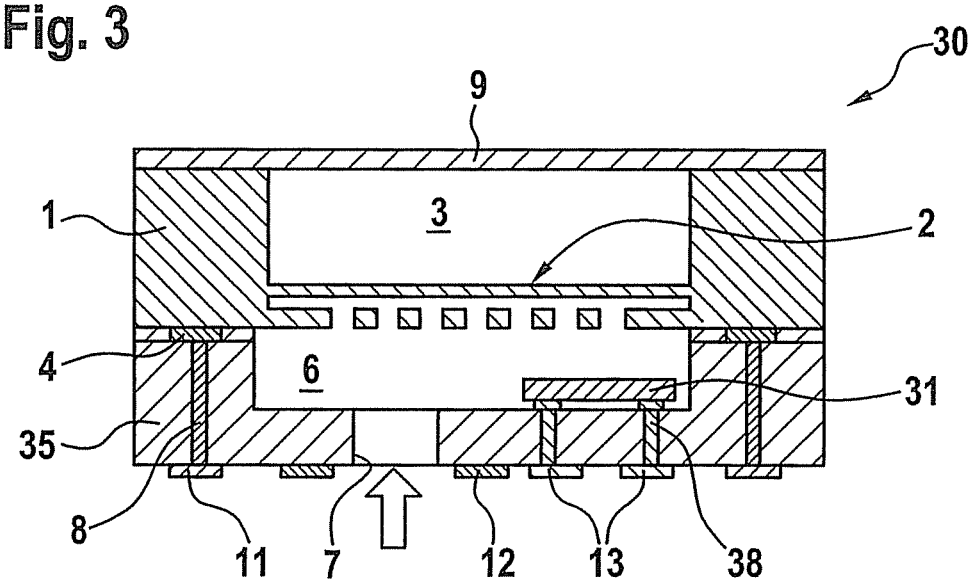

MEMS microphone package 10 shown in FIG. 1 is implemented in the form of a wafer-level package (WLP), i.e., in the form of a wafer stack. It includes a microphone component 1, which is referred to hereafter as a microphone chip 1. An acoustically sensitive diaphragm structure 2 in the form of a diaphragm having a counter electrode, which spans a cavity 3 in the chip rear side, is implemented in the front side of microphone chip 1. Circuit elements are typically also situated on the front side of a microphone chip, which are not shown here for reasons of clarity, however. Only electrical contacts 4 for the signal transmission are shown.

In addition, package 10 includes an interposer 5, which is situated on the front side of microphone chip 1. A recess 6, which extends over the entire diaphragm area, is formed in the surface of interposer 5 facing toward microphone chip 1. Interposer 5 may be a semiconductor wafer which is structured on the rear, for example. The connection between microphone chip 1 and interposer 5 was established here with the aid of wafer-level bonding, but may also be glued, soldered, glazed, or alloyed. In any case, it is to be acoustically sealed and sealed in such a way that the microphone structure and the circuit components on the front side of microphone chip 1 are protected from environmental influences.

Sound is applied to diaphragm structure 2 via a passage aperture 7 in interposer 5, whose cross-sectional area is significantly smaller than the lateral extension of the diaphragm structure. This acoustical aperture 7 opens into a recess 6 of interposer 5, which functions here as the front volume for diaphragm structure 2. Cavity 3, which is closed here by an unstructured, closed, relatively thin plate 9 on the rear side of microphone chip 1, is used as the rear side volume. This plate 9 additionally provides package 10 with a closed, robust surface. The rear side volume may also be closed with the aid of a film, however, which is applied at the wafer level to the rear side of the microphone chip. The use of a structured rear wafer having a cavity for enlarging the rear side volume is particularly advantageous. Alternatively, an appropriately molded plastic part could also be used. In any case, the connection between rear closure 9 and microphone chip 1—and also the connection between microphone chip 1 and interposer 5—may be established at the wafer level.

Since package 10 is placed at its usage site and assembled via interposer 5, through contacts 8 are designed in interposer 5, which electrically connect electrical contacts 4 on the front side of microphone chip 1 to connection contacts 11 on the assembly side of interposer 5. The circuit components situated on the front side of microphone chip 1 are electrically contacted at the assembly site in this way.

During the second-level assembly, the microphone structure is sealed in relation to the second-level printed circuit board, so that reworking processes may also still be carried out after the second-level assembly, without impairing the microphone function. A sealing material, which is applied on the assembly side of interposer 5 on an annular contact area 12 in the border area of acoustical aperture 7, is used for this purpose. This material may be a solder or also a silicone adhesive, for example.

Although acoustical aperture 7 is situated on the assembly side of package 10, sensitive diaphragm structure 2 is well protected against contamination during the second-level assembly process, for example, by the penetration of flux vapors, since the cross-sectional area of passage aperture 7 in interposer 5 is significantly smaller than the lateral extension of cavity 6 between interposer 5 and diaphragm structure 2.

A further advantage results from these size ratios, which is also illustrated by FIG. 1. Connection contacts 11 for electrically contacting package 10 are not limited to the frame area of diaphragm structure 2 here, but rather even extend beyond diaphragm structure 2. Since passage aperture 7 in interposer 5 is smaller than the diaphragm area, connection contacts 11 may be designed having a relatively large area independent of the diaphragm area, without the assembly area of package 10 thus having to be enlarged. This also opens up the option of displacing connection contacts 11 from the border area of the assembly area more into the inner area of the assembly area, their shape fundamentally being arbitrary.

MEMS microphone package 20 shown in FIG. 2 differs from above-described MEMS microphone package 10 solely in the type of the interposer. Therefore, identical reference numerals are also used hereafter for identical components.

MEMS microphone package 20 is also a wafer-level package (WLP), which includes a microphone chip 1 having an acoustically sensitive diaphragm structure 2 in the chip front side and a cavity 3 in the chip rear side. In addition, electrical contacts 4 of microphone chip 1 are shown on the chip front side. The rear side of microphone chip 1 is connected to an unstructured, closed, relatively thin plate 9, which closes the rear side volume of the microphone diaphragm. An interposer 25 is situated on the front side of microphone chip 1, in which an acoustical aperture 27 is situated. This aperture is significantly smaller than the diaphragm area of the diaphragm structure.

In contrast to MEMS microphone package 10, interposer 25 is implemented here in the form of a chip stack, including a planar interposer chip 251, in which acoustical aperture 27 is formed, and a spacer 252, via which interposer chip 251 is connected to the front side of microphone chip 1, so that there is a cavity 26 between diaphragm structure 2 and interposer chip 251. This cavity 26 is used as the front volume for diaphragm structure 2. In the exemplary embodiment shown here, interposer chip 251 is an ASIC, into which parts of the signal processing for microphone chip 1 may be integrated, for example. The circuit elements of ASIC 251 are integrated into the surface facing away from microchip 1, on which connection contacts 11 of MEMS microphone package 20 for the second-level assembly are also situated. Spacer 252 is implemented in the form of a semiconductor wafer having a passage aperture, whose cross-sectional area at least corresponds to the lateral extension of diaphragm structure 2 and thus forms cavity 26.

The mechanical connection between spacer 252 and interposer chip 251 and also the mechanical connection between spacer 252 and microphone chip 1 are acoustically sealed and were established here with the aid of wafer-level bonding.

The electrical connection between microphone chip 1 or electrical contacts 4 of microphone chip 1 and the circuit elements of ASIC 251 and connection contacts 11 is established with the aid of through contacts 282 in the frame area of spacer 251 and with the aid of through contacts 281 in ASIC 251. These through contacts 281 and 282 are electrically connected via contact areas 283 on the adjoining surfaces of spacer 252 and ASIC 251.

The active surface of ASIC 251 is protected by the second-level assembly in a similar way as the microphone structure, and the circuit components on the front side of microphone chip 1 are protected by interposer 25 against environmental influences. A sealing ring on contact area 12 on the periphery of acoustical aperture 27 also contributes to this protection, the sealing ring not only sealing the microphone structure in relation to the second-level printed circuit board, but rather also separating the ASIC circuit components on the assembly side of package 20 from the media access in the second-level printed circuit board.

It is also to be noted with respect to the exemplary embodiments shown in FIGS. 1 and 2 that an interposer composed of multiple chips does not necessarily have to include an ASIC, and an ASIC may also be used as an interposer in the case of a one-piece interposer. For this purpose, the ASIC would merely have to be provided with a passage aperture, which opens into a recess in the rear side of the ASIC corresponding to the diaphragm area.

A MEMS microphone package 30 is also shown in FIG. 3, which includes an ASIC 31 in addition to a microphone chip 1, as has already been described in connection with FIGS. 1 and 2.

As in the cases of FIGS. 1 and 2, the rear side volume of the microphone structure is closed by an unstructured, closed, relatively thin plate 9 on the rear side of microphone chip 1, while an interposer 35 having an acoustical aperture 7 is situated on the front side of microphone chip 1.

In the exemplary embodiment shown here, interposer 35 is a semiconductor wafer having a recess 6 in the surface facing toward microphone chip 1. This recess 6 extends at least over the entire diaphragm structure, so that there is a cavity 6 between diaphragm structure 2 and interposer 35. Acoustical aperture 7, whose cross-sectional area is significantly smaller than the lateral extension of the diaphragm area, is not situated centrally under diaphragm structure 2 here, but rather laterally, thereby creating an assembly area for ASIC 31, which is significantly smaller than microphone chip 1, on interposer 35 in the area of recess 6. ASIC 31 was installed in a chip-to-wafer method in recess 6 of interposer 35, before interposer 35 and microphone chip 1 were connected to one another in an acoustically sealed way.

Since the second-level assembly of package 30 takes place via interposer 35, interposer 35 is equipped with through contacts 8 for electrically contacting microphone chip 1, on the one hand, and with through contacts 38 for electrically contacting ASIC 31, on the other hand. Through contacts 8 are situated in the frame area of interposer 35 and extend from electrical contacts 4 on the front side of microphone chip 1 to connection contacts 11 on the assembly side of interposer 35. In contrast thereto, through contacts 38 are situated in the area of recess 6 and connect the electrical terminals of ASIC 31 to corresponding connection contacts 13 on the assembly side of interposer 35.

In all of the above-mentioned and described embodiment variants of the packaging concept according to the present invention, it has proven to be advantageous if the interposer and optionally the further layer on the rear side of the microphone component are made of an electrically conductive material or are at least coated using an electrically conductive material, in order to shield the microphone structure against electromagnetic interference.

All above-described packages may be applied in the wafer composite, manufactured using standard methods of chip manufacturing, and assembled after the separation on a second-level substrate, for example, on a ceramic substrate or on a printed circuit board. This substrate may in turn be sawn up in order to complete the packaging of the individual packages. In any case, the substrate provides the particular package with additional mechanical protection and may additionally protect against incident light and electromagnetic interference.

What is claimed is:

1. A component, comprising:
   a MEMS component having at least one diaphragm structure implemented in a front side of the MEMS component front side; and
   an interposer connected to the front side of the MEMS component which has at least one passage aperture as an access opening to the diaphragm structure of the MEMS component and which is provided with electrical through contacts so that the MEMS component is electrically contactable via the interposer, a cross-sectional area of the at least one passage aperture in the interposer being significantly smaller than an area of the diaphragm structure of the MEMS component, and the at least one passage aperture opens into a cavity between the diaphragm structure and the interposer, wherein the interposer is implemented as a chip having a same chip surface area as the MEMS component.

2. The component as recited in claim 1, further comprising:
   connection contacts on a surface of the interposer facing away from the MEMS component in an area above the diaphragm structure to electrically contact the component within a second-level assembly.

3. The component as recited in claim 1, wherein a cavity is formed in the surface of the interposer chip facing toward the MEMS component which functions as the cavity between the diaphragm structure and the interposer.

4. The component as recited in claim 1, wherein the interposer includes a planar interposer chip having a same chip surface area as the MEMS component and at least one spacer, the at least one passage aperture being formed in the planar interposer chip, and the planar interposer chip being mechanically and electrically connected via the spacer to the front side of the MEMS component to implement the cavity between the diaphragm structure and the interposer.

5. The component as recited in claim 3, wherein an ASIC is the interposer chip, the front side of the MEMS component facing toward a rear side of the ASIC.

6. The component as recited in claim 1, wherein the interposer functions as a carrier for at least one further component, the further component being situated in an area of the cavity between the diaphragm structure and the interposer, and the interposer is provided with electrical through contacts for electrically contacting the further component.

7. The component as recited in claim 1, further comprising:
   a sealing material for a second-level assembly of the component, the sealing material being applied to a surface of the interposer facing away from the MEMS component in a border area of the at least one passage aperture.

8. The component as recited in claim 7, further comprising:
   at least one further layer applied to a rear side of the MEMS component, the at least one further layer being in a form of one of a film or a rear wafer, and being made of one of plastic, glass, or a semiconductor material.

9. The component as recited in claim 1, wherein the MEMS component is a MEMS microphone component, a rear side volume of a microphone diaphragm being defined by a structured rear wafer, in which at least one of a recess for enlarging the rear side volume, and vents, is implemented, which communicate with the rear side volume of the microphone diaphragm.

* * * * *